United States Patent
Pace et al.

(10) Patent No.: US 12,129,542 B2
(45) Date of Patent: Oct. 29, 2024

(54) VACUUM DEPOSITION FACILITY AND METHOD FOR COATING A SUBSTRATE WITH TRANSVERSE REPARTITION CHAMBER

(71) Applicant: ArcelorMittal, Luxembourg (LU)

(72) Inventors: Sergio Pace, Jodoigne (BE); Bruno Schmitz, Nandrin (BE); Didier Marneffe, Engis (BE); Eric Silberberg, Haltinne (BE)

(73) Assignee: ArcelorMittal, Luxembourg (LU)

( * ) Notice: Subject to any disclaimer, the term of this patent is extended or adjusted under 35 U.S.C. 154(b) by 784 days.

(21) Appl. No.: 16/972,176

(22) PCT Filed: Jun. 11, 2019

(86) PCT No.: PCT/IB2019/054860
§ 371 (c)(1),
(2) Date: Dec. 4, 2020

(87) PCT Pub. No.: WO2019/239314
PCT Pub. Date: Dec. 19, 2019

(65) Prior Publication Data
US 2021/0238734 A1   Aug. 5, 2021

(30) Foreign Application Priority Data

Jun. 15, 2018   (WO) .................. PCT/IB2018/054419

(51) Int. Cl.
*C23C 14/56*   (2006.01)
*C23C 14/24*   (2006.01)

(52) U.S. Cl.
CPC .......... *C23C 14/562* (2013.01); *C23C 14/243* (2013.01)

(58) Field of Classification Search
CPC ............................ C23C 14/562; C23C 14/243
See application file for complete search history.

(56) References Cited

U.S. PATENT DOCUMENTS 2,426,377 A * 8/1947 Smith, Jr. ............... C23C 14/24
                                                          118/325
2,793,609 A * 5/1957 Tzu ......................... B01D 3/10
                                                          118/726
(Continued)

FOREIGN PATENT DOCUMENTS

CN    103589997 A    2/2014
DE    69730429 T2    9/2005
(Continued)

OTHER PUBLICATIONS

Merriam-Webster, Definition of Cylinder (Year: 2024), "https://www.merriam-webster.com/dictionary/tube", Merriam-Webster, Inc.*
(Continued)

*Primary Examiner* — Karl Kurple
(74) *Attorney, Agent, or Firm* — Davidson Kappel LLC

(57) ABSTRACT

A vacuum deposition facility 1 for continuously depositing, on a running substrate S, coatings formed from metal or metal alloy, the facility including an evaporation crucible 4 suited to supply metal or metal alloy vapor and including an evaporation pipe 7, a deposition chamber 2 suited to have the substrate S run through along a given path P and a vapor jet coater 3 linking the evaporation pipe to the deposition chamber, wherein the vapor jet coater further includes a repartition chamber 31 including at least one reheater 33 positioned within the repartition chamber and a vapor outlet orifice 32 including a base opening linking the vapor outlet orifice to the repartition chamber, a top opening through which the vapor can exit in the deposition chamber and two sides converging toward each other in the direction of the top opening.

8 Claims, 2 Drawing Sheets

(56) References Cited

U.S. PATENT DOCUMENTS

| | | | | |
|---|---|---|---|---|
| 4,152,478 A * | 5/1979 | Takagi | C23C 14/221 | |
| | | | 428/221 | |
| 4,401,052 A * | 8/1983 | Baron | C23C 14/56 | |
| | | | 118/726 | |
| 4,812,326 A * | 3/1989 | Tsukazaki | C23C 14/243 | |
| | | | 427/523 | |
| 5,149,375 A * | 9/1992 | Matsuyama | C23C 16/452 | |
| | | | 118/723 HC | |
| 7,815,737 B2 * | 10/2010 | Kim | H10K 71/40 | |
| | | | 118/726 | |
| 9,790,588 B2 * | 10/2017 | Liu | H05B 6/36 | |
| 11,434,560 B2 * | 9/2022 | Banaszak | C23C 14/16 | |
| 2002/0192375 A1 * | 12/2002 | Sun | C23C 14/243 | |
| | | | 118/726 | |
| 2009/0255802 A1 * | 10/2009 | Donchev | H01J 37/32009 | |
| | | | 204/192.12 | |
| 2010/0206233 A1 * | 8/2010 | Long | C23C 14/243 | |
| | | | 118/724 | |
| 2011/0000431 A1 * | 1/2011 | Banaszak | C23C 14/562 | |
| | | | 118/694 | |
| 2011/0027462 A1 * | 2/2011 | Hwang | C23C 14/0623 | |
| | | | 118/314 | |
| 2011/0033973 A1 * | 2/2011 | Cok | C23C 14/243 | |
| | | | 118/726 | |
| 2013/0189445 A1 | 7/2013 | Jung et al. | | |
| 2018/0258521 A1 * | 9/2018 | Inoue | C23C 14/243 | |
| 2021/0017640 A1 * | 1/2021 | Nam | C23C 14/562 | |
| 2022/0399212 A1 * | 12/2022 | Kumakura | H01L 21/02063 | |

FOREIGN PATENT DOCUMENTS

| | | |
|---|---|---|
| EP | 1 215307 A2 | 6/2002 |
| JP | S5943874 A | 3/1984 |
| JP | H073463 A | 1/1995 |
| JP | H09143692 | 6/1997 |
| JP | 2000096214 A | 4/2000 |
| JP | 2004079541 A | 3/2004 |
| JP | 2004307877 A | 11/2004 |
| JP | 2007039785 A | 2/2007 |
| JP | 2008150649 A | 7/2008 |
| JP | 2015209593 A | 11/2015 |
| WO | WO97/47782 | 12/1997 |
| WO | WO2009/047333 | 4/2009 |
| WO | WO2018020296 A1 | 2/2018 |
| WO | WO2018020311 A1 | 2/2018 |

OTHER PUBLICATIONS

Cambridge Dictionary, Definition of tube (Year: 2024), "https://dictionary.cambridge.org/US/dictionary/english/cylinder", Cambridge University Press & Assessment 2024.*

International Search Report of PCT/IB2019/054860, dated Oct. 1, 2019.

* cited by examiner

VACUUM DEPOSITION FACILITY AND METHOD FOR COATING A SUBSTRATE WITH TRANSVERSE REPARTITION CHAMBER

The present invention relates to a vacuum deposition facility for depositing, on a substrate, coatings formed from metal or metal alloys such as for example zinc and zinc-magnesium alloys, said facility being more particularly intended for coating steel strip, without being limited thereto. The present invention also relates to the method for coating a substrate thereof.

BACKGROUND

Various processes for depositing metal coatings, eventually composed of alloys, on a substrate, such as a steel strip, are known. Among these, mention may be made of hot-dip coating, electrodeposition and also the various vacuum deposition processes, such as vacuum evaporation and magnetron sputtering.

It is known from WO97/47782 and WO2009/047333 a method for the continuous coating of a steel substrate in which a metallic vapor spray, propelled at a speed greater than 500 m/s, comes in contact with the substrate. Nevertheless, it has been observed that zinc vapors tend to condensate which leads to microdroplet-like defects in and on the metallic coating.

SUMMARY OF THE INVENTION

An aim of the present invention is to remedy the drawbacks of the facilities and processes of the prior art by providing a vacuum deposition facility that prevents condensation of metal or metal alloys vapors.

The present invention provides a vacuum deposition facility for continuously depositing, on a running substrate, coatings formed from metal or metal alloy, the facility comprising an evaporation crucible suited to supply metal or metal alloy vapor and comprising an evaporation pipe, a deposition chamber suited to have the substrate run through along a given path and a vapor jet coater linking the evaporation pipe to the deposition chamber, wherein the vapor jet coater further comprises:
- a repartition chamber extending transversely from the evaporation pipe and across the width of the given path and comprising at least one reheating means positioned within the repartition chamber and,
- a vapor outlet orifice comprising a base opening linking the vapor outlet orifice to the repartition chamber, a top opening through which the vapor can exit in the deposition chamber and two sides linking the base opening to the top opening wherein the sides of the vapor outlet orifice converge toward each other in the direction of the top opening.

The facility according to the invention may also have the optional features listed below, considered individually or in combination:
- the vapor outlet orifice is a trapezoid in cross-section along a plane perpendicular to its length,
- the vapor outlet orifice is an isosceles trapezoid in cross-section along a plane perpendicular to its length,
- the base angle of the isosceles trapezoid has a value above 60°,
- the sides of the vapor outlet orifice are converging exponentially toward each other in the direction of the top opening,
- the angle between the base opening and each side has a value above 60° at the exit of the vapor outlet orifice,
- the ratio between the width of the base opening and the width of the top opening of the vapor outlet orifice is comprised between 1.6 and 2.4,
- the ratio between the side length and the base opening width is comprised between 4 et 8.

Other characteristics and advantages of the invention will be described in greater detail in the following description.

BRIEF DESCRIPTION OF THE DRAWINGS

The invention will be better understood by reading the following description, which is provided purely for purposes of explanation and is in no way intended to be restrictive, with reference to:

FIG. 1, which is a cross-section of an embodiment of a facility according to the invention, FIG. 2, which is a cross-section of an embodiment of a vapor jet coater according to the invention, FIGS. 3a and 3b, which are the results of numerical modelling comparing the invention in FIG. 3b to the prior art in FIG. 3a.

DETAILED DESCRIPTION

It should be noted that the terms "lower", "beneath", "inward", "inwards", "outward", "outwards", "upstream", "downstream", . . . as used in this application refer to the positions and orientations of the different constituent elements of the facility when the latter is installed on a vacuum deposition line.

The aim of the present invention is to deposit, on a substrate, coatings formed from metal or metal alloys. The aim is in particular to obtain zinc or zinc-magnesium coatings. However, the process is not limited to these coatings, but preferably encompasses any coating based on one single metal or on a metal alloy whose elements have vapor pressures at the bath temperature not differing by more than 10%, as controlling their respective relative content is then facilitated.

To give an indication, mention may thus be made of coatings made of zinc, as main element, and additional element(s), such as chromium, nickel, titanium, manganese, magnesium, silicium and aluminum, considered individually or in combination.

The thickness of the coating will preferably be between 0.1 and 20 µm. On one hand, below 0.1 µm, there would be a risk that the corrosion protection of the substrate would be insufficient. On the other hand, it is unnecessary to go beyond 20 µm in order to have the level of corrosion resistance which is required, in particular, in the automotive or construction field. In general, the thickness may be limited to 10 µm for automotive applications.

Figure 1:
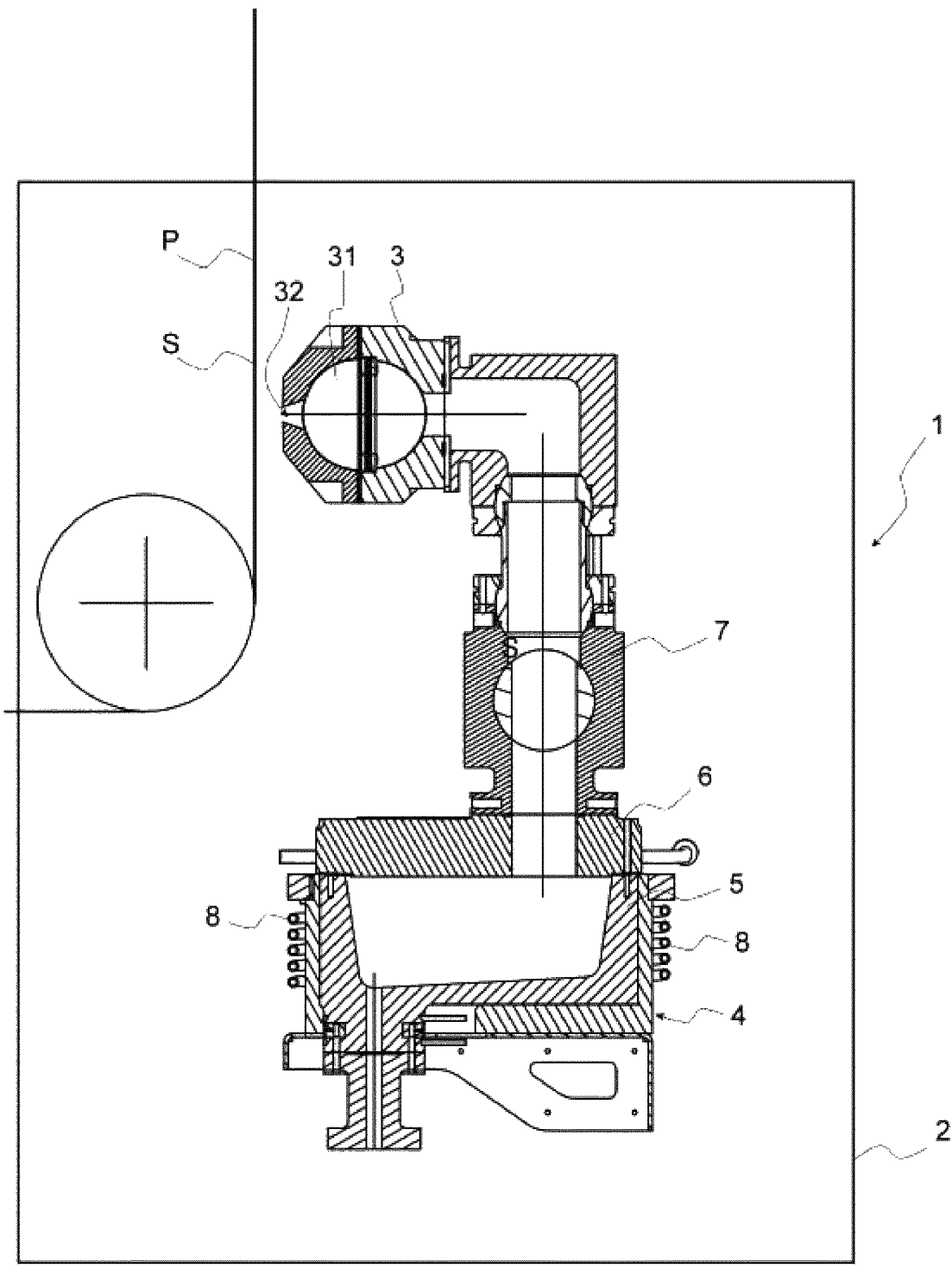

With reference to FIG. 1, the facility 1 according to the invention first comprises a deposition chamber 2 and a means for running the substrate through the chamber.

This deposition chamber 2 is a hermetically-sealable box preferably kept at a pressure of between $10^{-8}$ and $10^{-3}$ bar. It has an entry lock and an exit lock (these not being shown) between which a substrate S, such as for example a steel strip, can run along a given path P in a running direction.

The substrate S may be made to run by any suitable means, depending on the nature and the shape of said substrate. A rotary support roller 3 on which a steel strip can bear may in particular be used.

In the deposition chamber 2, beside the face of the substrate S which has to be coated, there is a vapor jet coater 3. This coater is suited to spray onto the running substrate S a metal alloy vapor coming from an evaporation crucible 4.

The vapor jet coater 3 is mounted, directly or not, on the evaporation crucible 4. The latter is suited to contain the metal or metal alloy bath generating the vapor to be deposited on the substrate S and suited to feed the vapor jet coater with the metallic vapor. The evaporation crucible 4 is preferably located in the deposition chamber 2.

The evaporation crucible 4 mainly consists of a pot 5, a cover 6 and an evaporation pipe 7 connected on one side on the cover and on the other side on the vapor jet coater 3. Preferably, a valve placed between the evaporator and the ejector controls the metallic vapor flow. These different parts may for example be made of graphite.

The evaporation crucible 4 is provided with heating means 8 enabling the metallic vapor to form and to feed the vapor jet coater 3. The evaporation crucible 4 is advantageously provided with an induction heater which has the advantage of making the stirring and the composition homogenization of the metal alloy bath easier.

The vapor jet coater 3 is preferably a sonic vapor jet coater, that is to say a coater capable of generating a vapor jet of sonic velocity. This type of coater is also usually referred to as a JVD (Jet Vapor Deposition) device. The reader may refer to the patent applications WO97/47782 and WO2009/047333 for a fuller description of the details of this type of device.

The vapor jet coater 3 advantageously comprises a repartition chamber 31 provided with a narrow vapor outlet orifice 32, the length of which is close to the width of the substrate to be coated. The repartition chamber allows the metallic vapor to be homogeneously distributed along the substrate width. Practically speaking, it extends transversely from the evaporation pipe 7 and across the width of the path P, i.e. across the substrate width when the facility is running. It is preferably extending in parallel to path P so that all points of the substrate are at the same distance from the vapor jet coater which further favors the homogeneity of the coating deposition. It is preferably in the form of a tube extending longitudinally across the path P. This chamber may for example be made of graphite.

The repartition chamber further comprises at least one reheating means 33 positioned within the repartition chamber, i.e. in the cavity delimited by the sides of the repartition chamber 31. It allows reheating the vapor coming from the evaporation pipe after it expanded when entering the repartition chamber. It therefore prevents condensation in the repartition chamber. The reheating means extends along the length of the repartition chamber, preferably along the complete length. It is preferably in the form of a heating cartridge. The number and position of the reheating means can be adjusted to optimize the reheating of the vapor.

The vapor outlet orifice 32 is basically a slot that can be preferably adjusted lengthwise and widthwise. The possibility of adapting its width makes it possible for the vapor jet to be maintained within a wide range of evaporated metal surface temperatures and therefore a wide range of evaporation rates. Furthermore, the possibility of adapting its length to the width of the substrate to be coated makes it possible to minimize the loss of evaporated metal.

Figure 2:
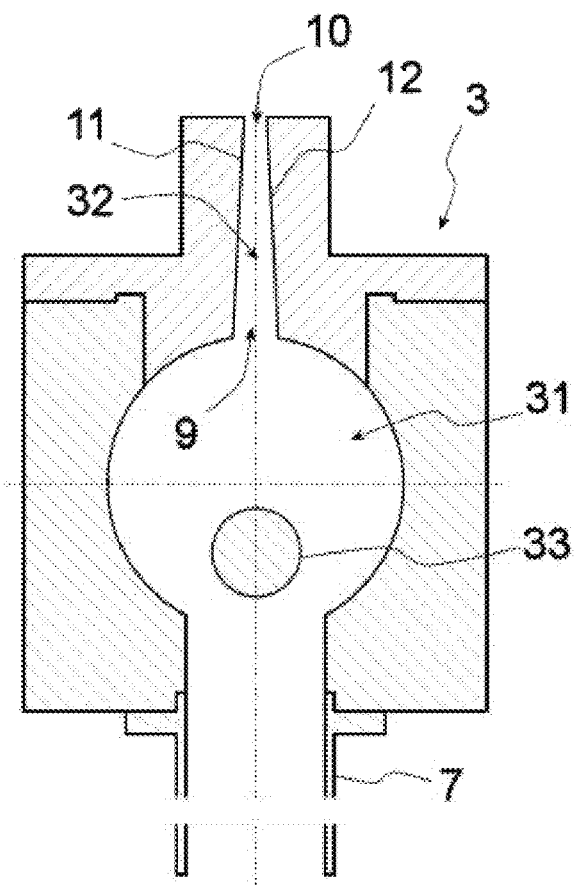

With reference to FIG. 2, in cross-section along a plane perpendicular to its length, the vapor outlet orifice comprises a base opening 9 cut in the wall of the repartition chamber 31 so as to link the vapor outlet orifice to the repartition chamber, a top opening 10 through which the vapor can exit in the deposition chamber and two sides 11, 12 linking the base opening to the top opening. The top opening 10 is preferably located in a plan parallel to path P so that the metal or metal alloys vapors are more homogeneously deposited on the substrate.

It has been surprisingly found by the inventors that the risk of condensation of metal or metal alloys vapors in the vapor jet coater 3 and in the evaporation pipe 7 was efficiently prevented if the sides 11, 12 of the vapor outlet orifice 32 were converging toward each other in the direction of the top opening. Without being bound by any scientific theory, it is inventors' understanding that this width restriction at the exit of the vapor outlet orifice 32 has the effect of localizing the sonic shock at the exit of the vapor outlet orifice 32 which prevents condensation before that point.

By "converging toward each other", it is meant that the top opening width of the vapor outlet orifice is smaller than the base opening width. It in no way limits the shape of the sides. The sides can be for example, straight lines, curved lines or combinations of both.

According to a first variant of the invention, the shape of the vapor outlet orifice 32, in cross-section, is a trapezoid. In that case, considering the general shape of the orifice, this means that the trapezoid small base is located at the exit of the vapor outlet orifice 32. This linear shortening of the orifice helps accelerating the vapor jet homogeneously and progressively. From an industrial point of view, this shape is also a good compromise between efficiency and ease of manufacturing.

More preferably, the shape of the vapor outlet orifice 32, in cross-section, is an isosceles trapezoid, i.e. a trapezoid where the sides 11, 12 have the same length, and the base angles have the same measure. Thanks to the reflection symmetry, the vapor jet exiting the vapor outlet orifice is more homogeneous.

Preferably the base angle has a value above 60°, and more preferably above 80°. This helps focusing the vapor jet on the substrate.

Preferably, the ratio between the base opening 9 and the top opening 10 of the vapor outlet orifice is comprised between 1.6 and 2.4. This was found to efficiently locate the sonic shock at the exit of the vapor outlet orifice while minimizing the pressure loss resulting from the shape of the orifice.

Preferably, the ratio between the side length and the base opening width is comprised between 4 and 8. Thanks to this ratio, the flux lines of the vapor jet have time to get stabilized after being disrupted at the junction between the repartition chamber 31 and the vapor outlet orifice 32.

According to a second variant of the invention, the sides 11, 12 of the vapor outlet orifice 32 are converging exponentially toward each other in the direction of the top opening 10. By "converging exponentially", it is meant that each side has in cross-section an exponential shape. This shape favors the transition between the repartition chamber and the vapor outlet orifice. The flux lines of the vapor jet are thus less disrupted at the junction between the repartition chamber and the vapor outlet orifice.

Preferably, the two sides 11, 12 have the same exponential shape. Thanks to the reflection symmetry, the vapor jet exiting the vapor outlet orifice is more homogeneous.

Preferably, the angle between the base opening 9 and the side has a value above 60° at the exit of the vapor outlet orifice, and more preferably above 80°. This helps focusing the vapor jet on the substrate.

Preferably, the ratio between the width of the base opening 9 and the width of the top opening 10 of the vapor outlet orifice is comprised between 1.6 and 2.4. This was found to efficiently locate the sonic shock at the exit of the vapor outlet orifice while minimizing the pressure loss resulting from the shape of the orifice.

Preferably, the ratio between the side length and the base opening width is comprised between 4 and 8. Thanks to this ratio, the flux lines of the vapor jet have time to get stabilized after being disrupted at the junction between the repartition chamber and the vapor outlet orifice.

In both variants, the width of the top opening 10 is adjusted depending of the flow rate required in the industrial vacuum deposition facility. The man skilled in the art will know how to adjust this width depending on the other parameters controlling the flow rate, notably on the basis of numerical modelling.

In both variants, the width of the base opening 9 and the width of the top opening 10 are preferably constant along the length of the vapor outlet orifice 32 so as to favor a homogeneous deposition of the metal or metal alloys vapors on the substrate.

Preferably, the two sides 11, 12 of the vapor outlet orifice are heated so as to limit the risk of condensation of metal or metal alloys vapors on them.

Numerical modelling has been performed to assess the efficiency of a facility comprising the vapor outlet orifice according to the invention.

The model has been applied to a facility comprising an evaporation pipe 7 connected on a vapor jet coater 3 comprising an repartition chamber 31 provided with a narrow vapor outlet orifice 32. In particular, the model was applied based on the following values:

Metal to be evaporated: zinc,
pressure at the entry of the evaporation pipe: 5869 Pa,
temperature at the entry of the evaporation pipe: 953K
temperature of the sides: 1042K
zinc flow rate: 170 g/s
Vapor valve fully opened.

Figure 3A:
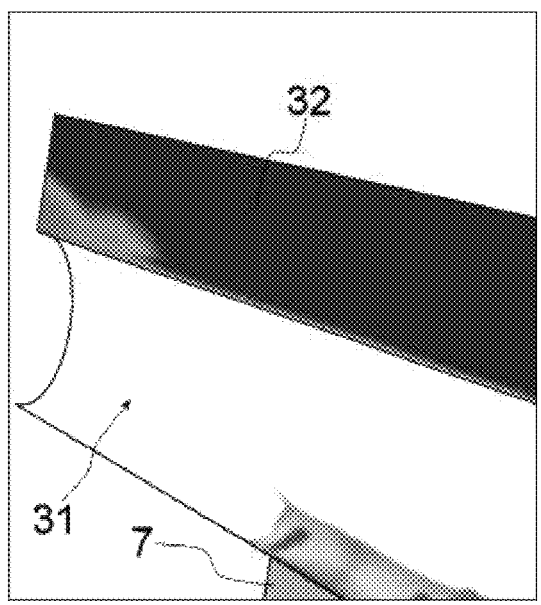

FIG. 3a shows the results obtained with a vapor outlet orifice 32 of rectangular cross-section, the base opening and the top opening being both of 24 mm, the orifice having a length of 1750 mm.

Figure 3B:
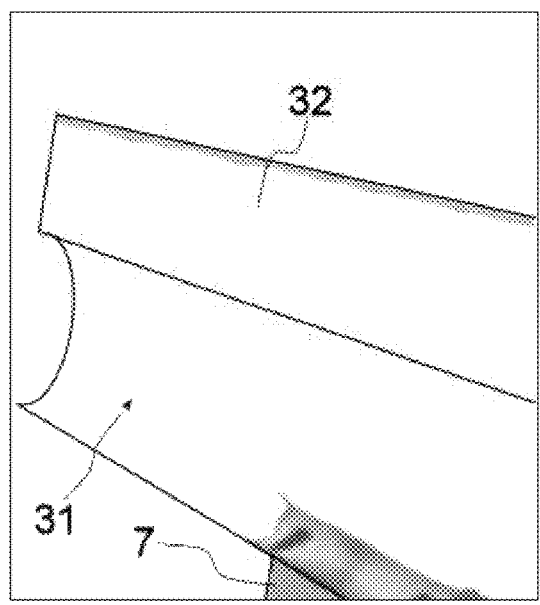

FIG. 3b shows the results obtained with a vapor outlet orifice 32 which, in cross-section, is an isosceles trapezoid, the base opening being of 48 mm, the top opening of 24 mm and the sides of 100 mm.

For both figures, the level of grey indicates the risk of condensation. The darker, the higher the risk of condensation.

As it is apparent when comparing FIG. 3a a) and FIG. 3b-b), zinc condensates in the rectangular outlet orifice while it doesn't in the trapezoidal outlet orifice.

The facility according to the invention applies more particularly, but not solely, to the treatment of metal strips, whether precoated or bare. Of course, the process according to the invention may be employed for any coated or uncoated substrate, such as for example aluminum strip, zinc strip, copper strip, glass strip or ceramic strip.

What is claimed is:

1. A vacuum deposition facility for continuously depositing coatings formed from a metal or a metal alloy on a substrate moving in a running direction, the vacuum deposition facility comprising:
    an evaporation crucible suited to supply a vapor of the metal or the metal alloy and including an evaporation pipe,
    a deposition chamber suited to have the substrate run through along a given path; and
    a vapor jet coater linking the evaporation pipe to the deposition chamber, the vapor jet coater including:
        a repartition chamber extending from the evaporation pipe in a direction across a width of the given path and transversely to a direction along a length of the evaporation pipe, the repartition chamber including at least one reheater positioned within the repartition chamber;
        the repartition chamber linked to a base opening of a vapor outlet orifice in the direction along the length of the evaporation pipe, the vapor outlet orifice including the base opening, a top opening, the vapor capable of exiting the deposition chamber through the top opening, and two sides linking the base opening to the top opening, the two sides of the vapor outlet orifice converge toward each other in a direction facing the top opening;
    wherein the repartition chamber is in a form of a tube extending longitudinally across the width of the given path.

2. The vacuum deposition facility as recited in claim 1 wherein the vapor outlet orifice is a trapezoid in cross-section along a plane perpendicular to its length.

3. The vacuum deposition facility as recited in claim 2 wherein the vapor outlet orifice is an isosceles trapezoid in cross-section along a plane perpendicular to a length of the vapor outlet orifice.

4. The vacuum deposition facility as recited in claim 3 wherein a base angle of the isosceles trapezoid has a value above 60°.

5. The vacuum deposition facility as recited in claim 1 wherein the sides of the vapor outlet orifice converge exponentially toward each other in the direction of the top opening.

6. The vacuum deposition facility as recited in claim 5 wherein, at the top opening of the vapor outlet orifice, the angle between the base opening and each side has a value above 60°.

7. The vacuum deposition facility as recited in claim 1 wherein a ratio between a width of the base opening and a width of the top opening of the vapor outlet orifice is between 1.6 and 2.4.

8. The vacuum deposition facility as recited in claim 1 wherein a ratio between the side length and the base opening width is between 4 and 8.

* * * * *